United States Patent
Lerner

(12) 
(10) Patent No.: US 6,634,650 B2
(45) Date of Patent: Oct. 21, 2003

(54) ROTARY VACUUM-CHUCK WITH WATER-ASSISTED LABYRINTH SEAL

(75) Inventor: Alexander Lerner, San Jose, CA (US)

(73) Assignee: Applied Materials, Inc., Santa Clara, CA (US)

(*) Notice: Subject to any disclaimer, the term of this patent is extended or adjusted under 35 U.S.C. 154(b) by 8 days.

(21) Appl. No.: 09/991,097

(22) Filed: Nov. 16, 2001

(65) Prior Publication Data

US 2003/0094773 A1 May 22, 2003

(51) Int. Cl.[7] ................................ B25B 11/00
(52) U.S. Cl. ..................... 279/3; 269/21; 277/412; 285/11
(58) Field of Search .............. 279/3; 277/412, 277/431; 285/11

(56) References Cited

U.S. PATENT DOCUMENTS

| | | | | |
|---|---|---|---|---|
| 1,213,494 A | * | 1/1917 | Ittner | 277/429 |
| 1,994,169 A | * | 3/1935 | Comins | 285/11 |
| 2,488,200 A | * | 11/1949 | Juhlin et al. | 277/408 |
| 3,075,753 A | * | 1/1963 | Akin | 285/11 |
| 3,410,335 A | * | 11/1968 | Malmstrom et al. | 285/10 |
| 4,235,446 A | * | 11/1980 | Verhey | 277/409 |
| 4,326,619 A | | 4/1982 | Garnett | |
| 4,557,506 A | | 12/1985 | Hanks et al. | |
| 5,036,625 A | | 8/1991 | Gosis | |
| 5,062,384 A | * | 11/1991 | Foley et al. | 279/3 |
| 5,472,215 A | * | 12/1995 | Gilbert | 285/11 |
| 5,527,209 A | | 6/1996 | Volodarsky et al. | |
| 5,707,186 A | | 1/1998 | Gobell et al. | |
| 5,749,584 A | | 5/1998 | Skinner et al. | |
| 5,829,087 A | | 11/1998 | Nishimura et al. | |
| 5,901,643 A | | 5/1999 | Bornhorst | |
| 6,082,377 A | | 7/2000 | Frey | |
| 6,101,698 A | * | 8/2000 | Estep et al. | 29/402.08 |

OTHER PUBLICATIONS

Patent Abstracts of Japan, Application No. 54063613, Dated Apr. 12, 1980.

* cited by examiner

*Primary Examiner*—Steven C. Bishop
(74) *Attorney, Agent, or Firm*—Dugan & Dugan

(57) ABSTRACT

A rotary vacuum-chuck mounts a substrate such as a silicon wafer for rotation. The vacuum-chuck includes a hollow rotary shaft and a chuck mounted on the hollow rotary shaft and having a surface adapted to support a substrate, the surface having one or more openings in fluid communication with the hollow rotary shaft. A vacuum generator evacuates the hollow rotary shaft and the one or more openings so as to vacuum chuck a substrate to the chuck surface. A labyrinthine gap is defined between a first member that rotates with the hollow rotary shaft and a second member that is stationary. A fluid in the labyrinthine gap provides a gas-tight seal between the first and second members.

9 Claims, 1 Drawing Sheet

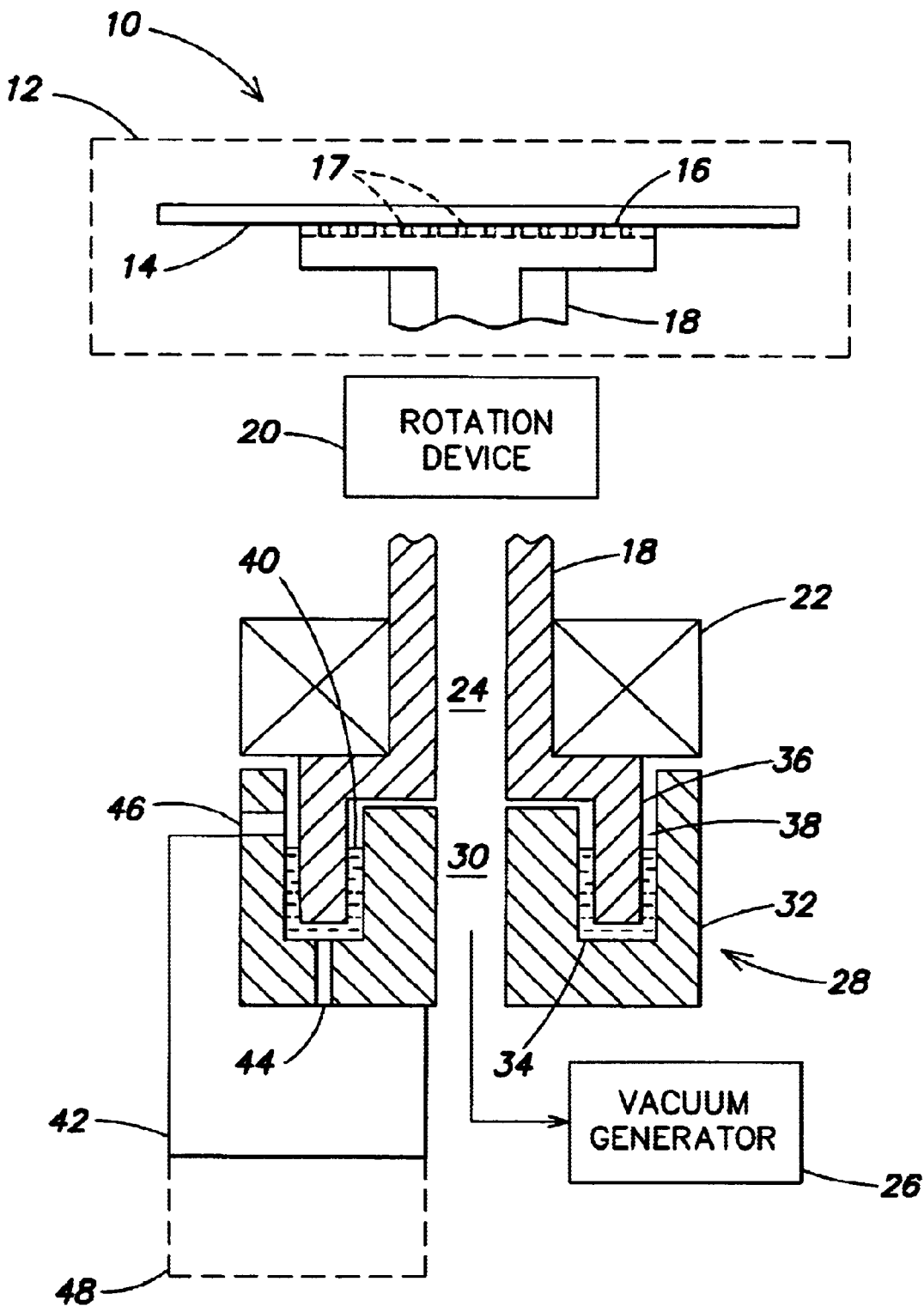

ROTARY VACUUM-CHUCK WITH WATER-ASSISTED LABYRINTH SEAL

FIELD OF THE INVENTION

The present invention is concerned with semiconductor manufacturing equipment, and is more particularly concerned with arrangements for securely holding a substrate while rotating the substrate.

BACKGROUND OF THE INVENTION

Semiconductor manufacturing generally entails performing a number of processes with respect to a substrate such as a silicon wafer to form integrated circuits on the substrate. For some of the processes it is necessary or desirable to hold the substrate in a horizontal position while rotating the substrate. For this purpose it is known to provide a rotary vacuum-chuck which holds the substrate horizontally on a chuck surface while rotating the substrate. The chuck surface is mounted on a hollow rotary shaft that is coupled to a vacuum generator. The hollow rotary shaft, in turn, is mounted on a rotary junction that includes a seal to maintain vacuum within the shaft. A conventional seal includes a disk that rotates with the shaft and a confronting stationary disk against which the rotary disk rubs.

Problems encountered with conventional seals for rotary vacuum-chucks include a limited useful life due to wear in the seal, and a tendency to generate particles that may contaminate the substrate that is being processed.

SUMMARY OF THE INVENTION

The present invention provides for an improved seal for a rotary vacuum-chuck. According to an aspect of the invention, a rotary vacuum-chuck adapted to mount a substrate for rotation is provided. The vacuum-chuck according to this aspect of the invention includes a hollow rotary shaft and a chuck mounted on the hollow rotary shaft and having a surface adapted to support a substrate, the surface having one or more openings in fluid communication with the hollow rotary shaft. Further included is a vacuum generator adapted to evacuate the hollow rotary shaft and the one or more openings. The vacuum-chuck of the invention further includes a labyrinthine gap defined between a first member that rotates with the hollow rotary shaft and a second member that is stationary. A fluid is provided in the labyrinthine gap and is adapted to provide a gas-tight seal between the first member and the second member.

The first member may be integrally formed with the hollow rotary shaft. The vacuum-chuck may further include a fluid recirculation system adapted to provide a flow of fluid in the labyrinthine gap. There may also be included in the vacuum-chuck a temperature control system associated with the fluid recirculation system and adapted to control the temperature of the fluid flowing in the labyrinthine gap. The fluid may be water.

With the vacuum-chuck of the present invention, the number of rubbing parts is reduced, so that the generation of potentially contaminating particles may also be reduced. Moreover, the useful life of the seal at the rotary hollow shaft may be extended, thereby reducing downtime and improving productivity.

Other features and advantages of the present invention will become more fully apparent from the following detailed description of the preferred embodiments, the appended claims and the accompanying drawings.

BRIEF DESCRIPTION OF THE DRAWINGS

FIG. 1 is a schematic vertical cross-sectional view of a substrate processing chamber, in pertinent part, including a rotary vacuum-chuck provided in accordance with the invention.

DETAILED DESCRIPTION OF PREFERRED EMBODIMENTS

An embodiment of the invention will now be described with reference to FIG. 1. FIG. 1 is a schematic vertical cross-sectional view of a substrate processing chamber, in pertinent part, including a rotary vacuum-chuck provided in accordance with the invention. In FIG. 1, reference numeral 10 generally indicates a substrate processing chamber in which the present invention is implemented. Dashed line 12 schematically represents an enclosure of the chamber 10 in which a substrate 14 such as a silicon wafer is secured for processing. The substrate 14 is secured on a conventional chuck surface 16 having openings through which vacuum is applied to the substrate 14. The chuck-surface 16 is mounted to a hollow rotary shaft 18. A rotation device (generally represented by reference number 20), such as a motor, may be coupled to an intermediate portion of the shaft 18 to impart rotation to the shaft 18, thereby also rotating the chuck surface 16 and the substrate 14 which is secured by vacuum to the chuck surface 16. The shaft 18 is supported for rotary motion on a bearing 22, which may, for example, be constituted by a bearing duplex set.

The rotary shaft 18 has a hollow inside space 24 which is coupled to a vacuum generator 26 via a housing, as described below. The vacuum generator 26 evacuates the inside space 24 so that vacuum can be applied to the openings (not shown) in the chuck surface 16 to secure the substrate 14 thereto. A water-assisted labyrinth seal 28 is provided at a junction between the inside space 24 of the rotary shaft 18 and a cylindrical hollow region 30 formed in a stationary housing 32 and arranged in alignment with the hollow inside space 24 of the shaft 18. The stationary housing 32 is coupled to the vacuum generator 26 so that vacuum suction may be transmitted through the hollow 30 of the housing 32 to the hollow inside space of the shaft 18.

The housing 32 also defines an annular pocket 34 which surrounds the cylindrical hollow 30 formed in the housing 32. A rotary member 36, which may be integrally formed with the shaft 18, is configured to define a labyrinthine gap 38 relative to the pocket 34. A fluid 40, such as water, is present in the gap 38 to provide a gas-tight seal at the junction between the inside space 24 of the shaft 18 and the cylindrical hollow 30 of the housing 32. The gap 38 defined between the rotary member 36 and the pocket 34 preferably has a ratio of serpentine length (i.e., the entire length of the gap 38, in the example shown two horizontal lengths and two vertical lengths) to width sufficient to prevent the fluid 40 from being sucked into the hollow regions 24 and 30 of the shaft and housing (e.g., at least about 10:1). For example, gap 38 may have a width of about 1 mm and a serpentine length of about 10 mm.

An optional water recirculation system 42 provides a flow of water in the gap 38. The water enters the gap 38 from the recirculation system 42 via an inlet 44, and exits the gap 38 to return to the recirculation system 42 via a drain 46. The drain 46 may have a wider diameter than the inlet 44 and may be positioned along a vertical section of the gap so that the water 40 does not back up and overflow the gap 38.

A temperature control device 48 may be associated with the water recirculation system 42 to control the temperature of the water flowing in the gap 38. This may be done, for example, to prevent overheating of the water and/or to control the temperature of the rotating shaft 18. The temperature control device 48 may include, for example, a conventional heat exchanger.

The substrate processing chamber 10 which is schematically illustrated in FIG. 1 may be any type of processing chamber in which a substrate is held in place via a vacuum and is rotated (i.e., a rotary vacuum chuck). For example, the processing chamber 10 may be employed for, and include suitable components required for, electroplating, photoresist developing, coating, or spin-rinse drying.

The water-assisted labyrinth seal provided for the rotary vacuum-chuck in accordance with the present invention may eliminate rubbing parts that are present in conventional seals for rotary vacuum-chucks. Consequently, the life of the seal may be extended, and the potential for generating particles reduced.

The foregoing description discloses only exemplary embodiments of the invention, and modifications of the above disclosed apparatus and methods which fall within the scope of the invention will be readily apparent to those of ordinary skill in the art. For example, although water is a preferred fluid to be introduced in the pocket 34, other fluids such as glycol or various oils may be used instead of water. The number, shape and size of the openings through which vacuum is applied to the substrate may vary. Also, the specific shapes of the components which define the labyrinthine seal are merely exemplary and other shapes may be readily employed. Although the rotary vacuum chuck is shown mounted to the floor of the chamber, in other embodiments it may be mounted to the ceiling or a side wall of the chamber, in which case appropriate modification of the labyrinthine seal's shape will be apparent to a worker of ordinary skill in the art. Accordingly, while the present invention has been disclosed in connection with exemplary embodiments thereof, it should be understood that other embodiments may fall within the spirit and scope of the invention, as defined by the following claims.

The invention claimed is:

1. A rotary vacuum-chuck adapted to mount a substrate for rotation, comprising:
    a hollow rotary shaft;
    a chuck mounted on the hollow rotary shaft and having a surface adapted to support a substrate, the surface having one or more openings in fluid communication with the hollow rotary shaft;
    a vacuum generator adapted to evacuate the hollow rotary shaft and the one or more openings;
    a labyrinthine gap defined between a first member that rotates with the hollow rotary shaft and a second member that is stationary; and
    a fluid in the labyrinthine gap so as to provide a gas-tight seal between the first member and the second member.

2. The vacuum-chuck of claim 1, wherein the first member is integrally formed with the hollow rotary shaft.

3. The vacuum-chuck of claim 1, further comprising a fluid recirculation system adapted to provide a flow of fluid in the labyrinthine gap.

4. The vacuum-chuck of claim 3, further comprising a temperature control system associated with the fluid recirculation system and adapted to control the temperature of the fluid flowing in the labyrinthine gap.

5. The vacuum-chuck of claim 1, wherein the fluid in the labyrinthine gap is water.

6. The vacuum-chuck of claim 1, wherein the labyrinthine gap has a length that is at least about 10 times a width of the labyrinthine gap.

7. A method of mounting a substrate for rotation, comprising:
    providing a hollow rotary shaft on which a chuck, having openings in fluid communication with the hollow rotary shaft, is mounted;
    evacuating the hollow rotary shaft and the openings;
    forming a labyrinthine gap between a first member that rotates with the hollow rotary shaft and a second member that is stationary; and
    introducing a fluid into the labyrinthine gap so as to form a gas tight seal between the first member and the second member.

8. The method of claim 7, further comprising recirculating the fluid to provide a flow of the fluid in the labyrinthine gap.

9. The method of claim 8, further comprising controlling the temperature of the recirculated fluid.

* * * * *